(12) United States Patent
Renkel, Jr. et al.

(10) Patent No.: US 8,416,566 B2
(45) Date of Patent: Apr. 9, 2013

(54) REAR COVER AND INPUT/OUTPUT PANELS

(75) Inventors: Leonard R. Renkel, Jr., Morganville, NJ (US); Robert Pellacani, Florida, NY (US); Corey Dayton, Newburgh, NY (US); Willie Braun, Franklin Lakes, NJ (US); Larry Fox, Nanuet, NY (US); Mahesh Mistry, Parsippany, NJ (US)

(73) Assignee: Fujitsu Limited, Kawasaki-shi (JP)

( * ) Notice: Subject to any disclaimer, the term of this patent is extended or adjusted under 35 U.S.C. 154(b) by 315 days.

(21) Appl. No.: 12/830,832

(22) Filed: Jul. 6, 2010

(65) Prior Publication Data
US 2012/0008285 A1  Jan. 12, 2012

(51) Int. Cl.
*G06F 1/16* (2006.01)
*H05K 5/00* (2006.01)
*H05K 7/00* (2006.01)

(52) U.S. Cl.
USPC .............. 361/679.45; 361/752; 361/753

(58) Field of Classification Search ............. 361/679.31, 361/679.4–679.45, 724–727, 748, 752, 753, 361/760; 439/625, 626, 638, 680
See application file for complete search history.

(56) References Cited

U.S. PATENT DOCUMENTS

| | | | | |
|---|---|---|---|---|
| 5,222,007 A * | 6/1993 | Suzuki et al. | ............... | 360/137 |
| 5,423,697 A * | 6/1995 | MacGregor | ............... | 439/638 |
| 5,460,547 A * | 10/1995 | Belt et al. | ............... | 439/638 |
| 5,569,052 A * | 10/1996 | Belt et al. | ............... | 439/638 |
| 5,676,553 A * | 10/1997 | Leung | ............... | 439/74 |
| 5,684,271 A * | 11/1997 | Scholder et al. | ............... | 174/382 |
| 5,687,387 A * | 11/1997 | Endejan et al. | ............... | 710/2 |
| 5,748,443 A * | 5/1998 | Flint et al. | ............... | 361/679.32 |
| 5,779,499 A * | 7/1998 | Sette et al. | ............... | 439/540.1 |
| 5,822,182 A * | 10/1998 | Scholder et al. | ............... | 361/679.57 |
| 5,940,275 A * | 8/1999 | Laity | ............... | 361/737 |
| 5,980,320 A * | 11/1999 | Slack et al. | ............... | 439/607.27 |
| 6,000,767 A * | 12/1999 | Liu et al. | ............... | 312/223.2 |
| 6,123,564 A * | 9/2000 | Belmore, III | ............... | 439/344 |
| 6,174,205 B1* | 1/2001 | Madsen et al. | ............... | 439/638 |
| 6,236,570 B1* | 5/2001 | Gotzfried et al. | ............... | 361/725 |
| 6,252,160 B1* | 6/2001 | Chang et al. | ............... | 174/382 |
| 6,282,594 B1* | 8/2001 | McTague et al. | ............... | 710/301 |
| 6,307,756 B1* | 10/2001 | Liu et al. | ............... | 361/816 |
| 6,321,340 B1* | 11/2001 | Shin et al. | ............... | 713/310 |
| 6,452,794 B1* | 9/2002 | Rumney | ............... | 361/679.4 |
| 6,483,709 B1* | 11/2002 | Layton | ............... | 361/724 |
| 6,558,201 B1* | 5/2003 | Begley et al. | ............... | 439/638 |
| 6,741,463 B1* | 5/2004 | Akhtar et al. | ............... | 361/679.41 |
| 6,796,844 B1* | 9/2004 | Edwards, III | ............... | 439/638 |

(Continued)

*Primary Examiner* — Adrian S Wilson
(74) *Attorney, Agent, or Firm* — Baker Botts L.L.P.

(57) ABSTRACT

An input/output panel for use with a server chassis may comprise a cover, an input/output interface circuit board, a plurality of interfaces, and a ground clip. The cover of non-conductive plastic may be configured to mount to a rear cover of the server chassis. The input/output interface circuit board may be disposed on a first side of the cover. The plurality of interfaces may be disposed on the input/output interface circuit board and extend at least partially through the cover to the second side of the cover. The ground clip may include a conductive component partially disposed within the plastic cover. A first end of the ground clip may extend from the first side of the cover and be configured to mate with the input/output interface circuit board. A second end of the ground clip may extend from the first side of cover and be configured to mate with a ground circuit associated with the rear cover of the server chassis.

28 Claims, 5 Drawing Sheets

U.S. PATENT DOCUMENTS

| | | | |
|---|---|---|---|
| 6,935,709 B2* | 8/2005 | Powell et al. | 312/223.2 |
| 7,001,219 B2* | 2/2006 | Dallmeier | 439/638 |
| 7,099,151 B2* | 8/2006 | Jones et al. | 361/679.02 |
| 7,303,434 B1* | 12/2007 | Chen et al. | 439/557 |
| 7,411,784 B2* | 8/2008 | Coglitore et al. | 361/679.41 |
| 7,460,375 B2* | 12/2008 | Randall et al. | 361/724 |
| 7,589,974 B2* | 9/2009 | Grady et al. | 361/735 |
| 7,690,944 B2* | 4/2010 | Matsumura et al. | 439/578 |
| 7,692,928 B2* | 4/2010 | Randall et al. | 361/724 |
| 7,716,408 B2* | 5/2010 | Bhatia et al. | 710/304 |
| 7,976,346 B2* | 7/2011 | Guy et al. | 439/638 |
| 2001/0049209 A1* | 12/2001 | Casey et al. | 439/76.1 |
| 2002/0067593 A1* | 6/2002 | Milan | 361/686 |
| 2003/0210530 A1* | 11/2003 | Powell et al. | 361/727 |
| 2005/0030704 A1* | 2/2005 | Sun et al. | 361/679 |
| 2006/0152908 A1* | 7/2006 | Berstis et al. | 361/725 |
| 2006/0193112 A1* | 8/2006 | Cauthron | 361/683 |
| 2007/0017883 A1* | 1/2007 | Bridges et al. | 211/26 |
| 2008/0049949 A1* | 2/2008 | Snider et al. | 381/86 |
| 2008/0130217 A1* | 6/2008 | Chen | 361/685 |
| 2008/0253076 A1* | 10/2008 | Chen | 361/684 |
| 2008/0298014 A1* | 12/2008 | Franco | 361/688 |
| 2009/0257187 A1* | 10/2009 | Mills et al. | 361/679.33 |
| 2010/0227493 A1* | 9/2010 | Guy et al. | 439/345 |
| 2011/0053394 A1* | 3/2011 | Hood et al. | 439/131 |
| 2011/0058298 A1* | 3/2011 | Kuczynski et al. | 361/103 |

* cited by examiner

REAR COVER AND INPUT/OUTPUT PANELS

TECHNICAL FIELD OF THE INVENTION

The present invention relates generally to server chassis for use with a communication network, and more particularly to rear covers and input/output panels for use with a server chassis.

BACKGROUND

Telecommunications systems, cable television systems, and data communication networks use optical networks to rapidly convey large amounts of information between remote points. In an optical network, information is conveyed in the form of optical signals through optical fibers. Optical fibers comprise thin strands of glass capable of transmitting the signals over long distances with very low loss. Optical networks provide higher capacity and reduced operating costs compared to traditional technologies. Fiber-optic networks may include a system of multiple network components, including switches, routers, converters, modulators, demodulators, etc.

One or more network components may be housed in a server chassis which may, in turn, be mounted in a rack system. A network component may include any equipment designed to be mounted in a rack and may be described as "rack-mount", "rack mounted", "rack mount chassis", or "shelf". In many cases, the server chassis provides electrical connections for the various components, physical connections between components and/or the rack system, and input/output access for cables, wiring, etc. Some rack systems include at least one shelf configured to receive and connect a variety of plug-in units (PIUs). The shelf may include a backplane providing electrical connections to the PIUs and mechanical features providing physical mounting and/or retaining force for the PIUs.

SUMMARY

In accordance with a particular embodiment of the present invention, an input/output panel for use with a server chassis may comprise a cover, an input/output interface circuit board, a plurality of interfaces, and a ground clip. The cover may be made of non-conductive plastic and configured to mount to a rear cover of the server chassis. The input/output interface circuit board may be disposed on a first side of the cover. The plurality of interfaces may be disposed on the input/output interface circuit board and extend at least partially through the cover to the second side of the cover. The ground clip may include a conductive component partially disposed within the plastic cover. A first end of the ground clip may extend from the first side of the cover and be configured to mate with the input/output interface circuit board. A second end of the ground clip may extend from the first side of cover and be configured to mate with a ground circuit associated with the rear cover of the server chassis.

In accordance with another particular embodiment of the present invention, a rear cover for use with a server chassis may comprise a panel, two cable brackets, and a ground strap. The panel may be made of non-conductive plastic and configured to mount to the rear of the server chassis adjacent a backplane disposed at least partially within the server chassis. The two cable brackets may extend from the panel, and provide a physical mounting location for cables and cable ties. The ground strap may include a conductive component partially disposed within the plastic panel. A first exposed portion of the ground strap may be configured to provide electrical connection with various electronic components disposed within the server chassis. A second exposed portion of the ground strap may be configured to mate with a ground circuit associated with the server chassis.

In accordance with another particular embodiment of the present invention, a server chassis for use with a communication network may comprise a shelf, one or more mounting brackets, a rear cover, and an input/output panel. The shelf may provide a housing for one or more electronic components of the communication network. The one or more mounting brackets may be configured to mount the shelf to a rack system. The rear cover may include a panel, a cable bracket, and a ground strap. The panel may be made of non-conductive plastic and configured to mount to the rear of the server chassis adjacent a backplane disposed at least partially within the shelf. The cable bracket may extend from the panel and provide a physical mounting location for cables and cable ties. The ground strap may include a conductive component partially disposed within the plastic panel. A first exposed portion of the ground strap may be configured to provide electrical connection with various electronic components disposed within the server chassis. The input/output panel may be configured to mount to the rear cover. The input/output panel may include a cover, an input/output circuit board, a plurality of interfaces, and a ground clip. The cover may be made of non-conductive plastic and configured to mount to the rear cover. The input/output interface circuit board may be disposed on a first side of the input/output panel. The plurality of interfaces may be disposed on the input/output interface circuit board and extend at least partially through the cover to the second side of the input/output panel. The ground clip may include a conductive component partially disposed within the plastic cover. A first end of the ground clip may extend from the first side of the cover and be configured to mate with the input/output interface circuit board. A second end of the ground clip may extend from the first side of the cover and be configured to mate with a second exposed portion of the ground strap of the rear cover.

The teachings of the present disclosure may provide a variety of benefits in comparison to known alternatives. Input/output panels, rear covers, and server chassis made out of metal provide electrical conductivity, but may require additional manufacturing and/or assembly processes. Input/output panels, rear covers, and server chassis made out of electrically conductive plastics provide electrical conductivity and reduced weight, but at an increased cost. In addition, electrically conductive plastics may require an increased amount of surface area at contact points. Input/output panels, rear covers, and server chassis implementing the teachings of the present disclosure may provide electrical conductivity and reduced weight without increasing material and/or manufacturing cost.

In addition, the teachings of the present disclosure provide integral molding processes that may provide reduced manufacturing complexity. For example, input/output panels, rear covers, and server chassis incorporating the teachings of the present disclosure may include alignment features that simplify use in the field as well as manufacturing. As another example, input/output panels, rear covers, and server chassis incorporating the teachings of the present disclosure may include installation and/or capture features that simplify use in the field as well as manufacturing. As another example, input/output panels, rear covers, and server chassis incorporating the teachings of the present disclosure may allow the use of extruded text instead of separate labels and/or silkscreens required with traditional designs.

It will be understood that the various embodiments of the present invention may include some, all, or none of the enumerated technical advantages. In addition, other technical advantages of the present invention may be readily apparent to one skilled in the art from the figures, description and claims included herein.

DETAILED DESCRIPTION

Preferred embodiments and their advantages are best understood by reference to FIGS. 1 through 4B, wherein like numbers are used to indicate like and corresponding parts. Modular communication systems may employ rack systems to mount a variety of electronic components.

Figure 1:
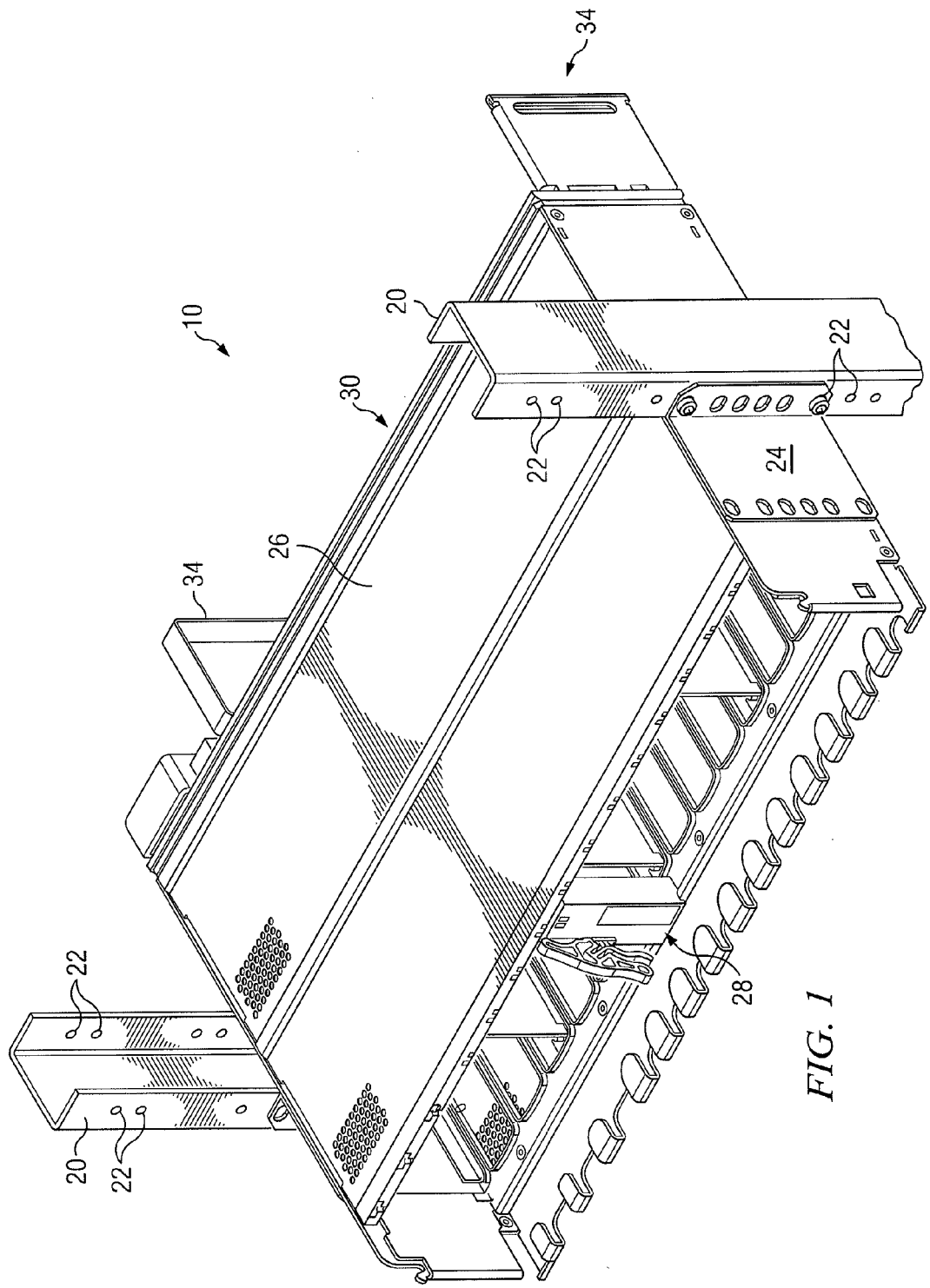
FIG. 1 illustrates example components of a rack system for use in a communication network incorporating teachings of the present disclosure.

FIG. 1 illustrates example components of a communication system including a rack system 10 for mounting various components of the communication system. Rack system 10 may include two or more upright posts 20. Upright posts 20 may include any device, component, and/or feature of rack system 10 configured to define one or more bays between two adjacent upright posts 20. In the embodiment shown in FIG. 1, upright posts 20 define a single bay. Upright posts 20 may include holes 22 defining one or more sets of mounting points for various components of the communication system. Holes 22 may be configured to allow attachment by bolts and/or other connectors.

Electronic components of the communication system may comprise any suitable hardware and/or software operable to provide functionality for the communications system, including any memory, processor, or other components. Electronic components may provide networking applications, such as telecommunications or data routing. Electronic components may comprise physical interfaces on the front side, the back side, or both to connect to other network components and send signals to and receive signals from such other network components. Various components of rack system 10 may provide a variety of functions, such as providing electrical connectivity between components of rack system 10 and transmitting signals between these components.

Some rack systems include at least one shelf 26 configured to receive and connect a variety of plug-in units (PIUs) 28. Shelf 26 may include a backplane (not expressly shown) providing electrical connections to PIU 28 and mechanical features providing physical mounting and/or retaining force for the PIU 28. In addition, shelf 26 may include mounting brackets 24 configured to provide a connection to upright posts 20.

Shelf 26 may include associated rear cover 30. When mounted to shelf 26, rear cover 30 may be disposed adjacent the backplane of shelf 26. Rear cover 30 may protect the backplane from unauthorized access and/or contamination. Rear cover 30 may provide electrical grounding for safety compliance and/or to reduce the risk of electrostatic discharge (ESD), electromagnetic interference (EMI), and/or electrical fast transients (EFT). In some embodiments, rear cover 30 may provide mounting and/or locating features for input/output panels (IOPs) 50 (discussed in more detail in relation to the following figures). In some embodiments, rear cover 30 may provide structural support for various cables associated with the communication system and/or the electronic components mounted in shelf 26 (e.g., cable ties 34).

Figure 2:
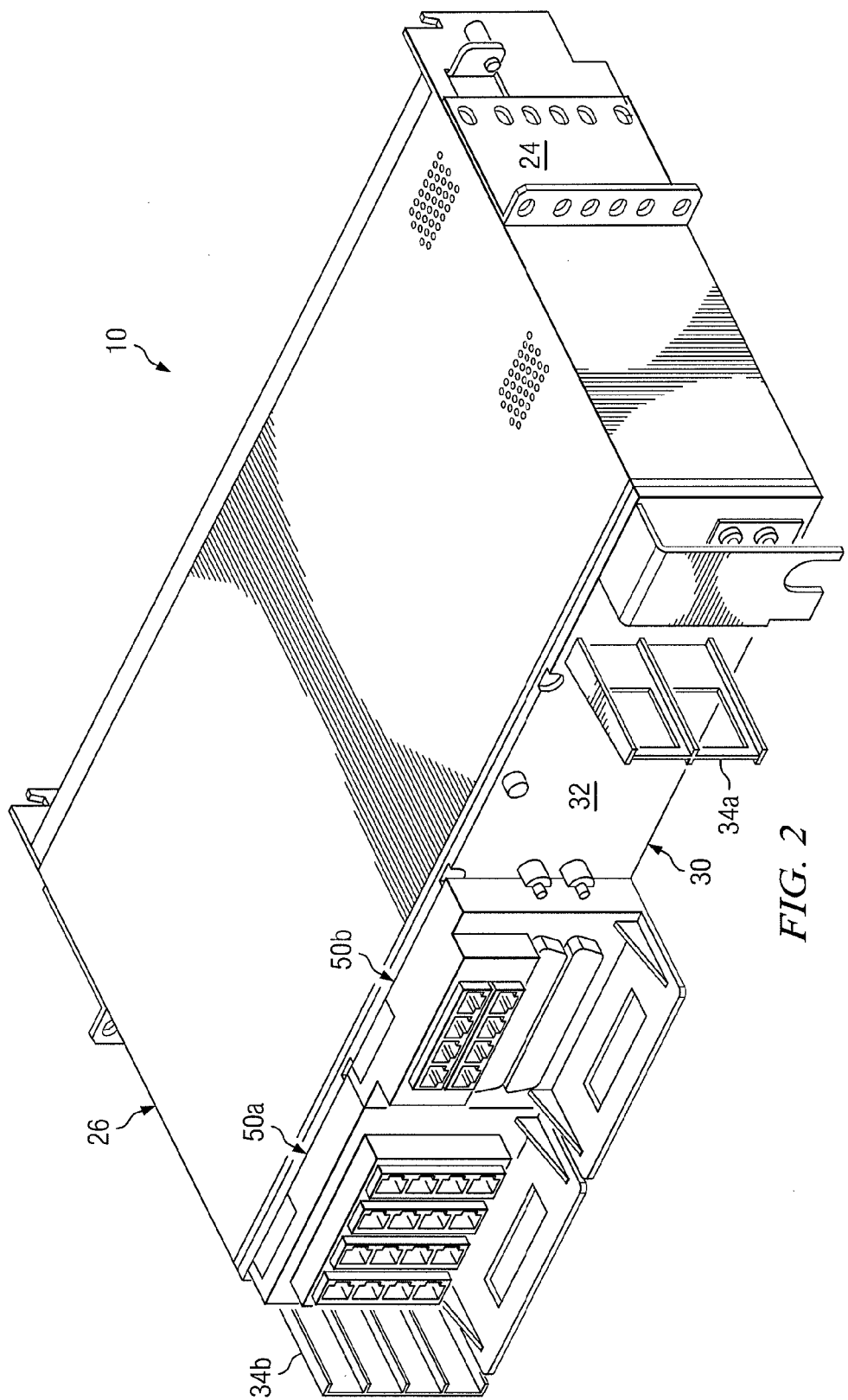
FIG. 2 illustrates an example server chassis and associated components for mounting electronics components in a rack system, in accordance with the teachings of the present disclosure.

FIG. 2 illustrates the reverse view of the server chassis shown in FIG. 1. As shown in this view, shelf 26 may include rear cover 30 with a panel 32, associated cable brackets 34a and 34b, and input/output panels 50. Panel 32 may be configured to mount to the rear of a server chassis (e.g., shelf 26) adjacent the backplane of the server chassis. Panel 32 may be fabricated from non-conductive plastic molded to the appropriate shape and configuration. Additional features of rear cover 30 and panel 32 are discussed with relation to FIGS. 3A and 3B.

Cable brackets 34a and 34b may provide structural features appropriate for attaching one or more cables. Cables may be used to provide electronic and/or power communication to various components associated with shelf 26 (e.g., I/O panels 50). Cable brackets 34 may be connected to panel 32 by snap fit and/or with separate connectors. If panel 32 and cable brackets 34 are both made of plastic, connecting cable brackets 34 by snap fit without separate connectors may reduce manufacturing complexity and cost.

I/O panels 50 may comprise a variety of connectors for transmitting one or more signals. For example, some I/O panels 50 may include one or more DS1 or DS3 connections. Other I/O panels 50 may include Ethernet connections, such as 10BASE-T, 100BASE-T, or 1000BASE-T. The particular design of I/O panel 50 may be selected by a user to provide the connections that the user needs for his or her applications. The user may also select an I/O panel 50 that provides a protected interface or one that provides an unprotected interface.

I/O panel 50 may be removably connected to rear cover 30 allowing a user to configure and/or modify the functions of shelf 26 depending on the various PIUs 28 disposed therein. In embodiments including removable I/O panels 50, users should be able to easily mount and connect I/O panel 50 to rear cover 30 without damaging mechanical and/or electrical connectors on either component. In addition, I/O panel 50 may require at least two electrical connections, including both electronic communication with the backplane and a connection to a ground circuit. In some embodiments, I/O panel 50 may be fabricated from non-conductive plastic to reduce weight, cost, and/or manufacturing complexity. Employing the teachings of the present disclosure may provide the benefits listed above while maintaining the ground circuit connection (discussed more fully in relation to FIGS. 4A and 4B).

Figure 3A:
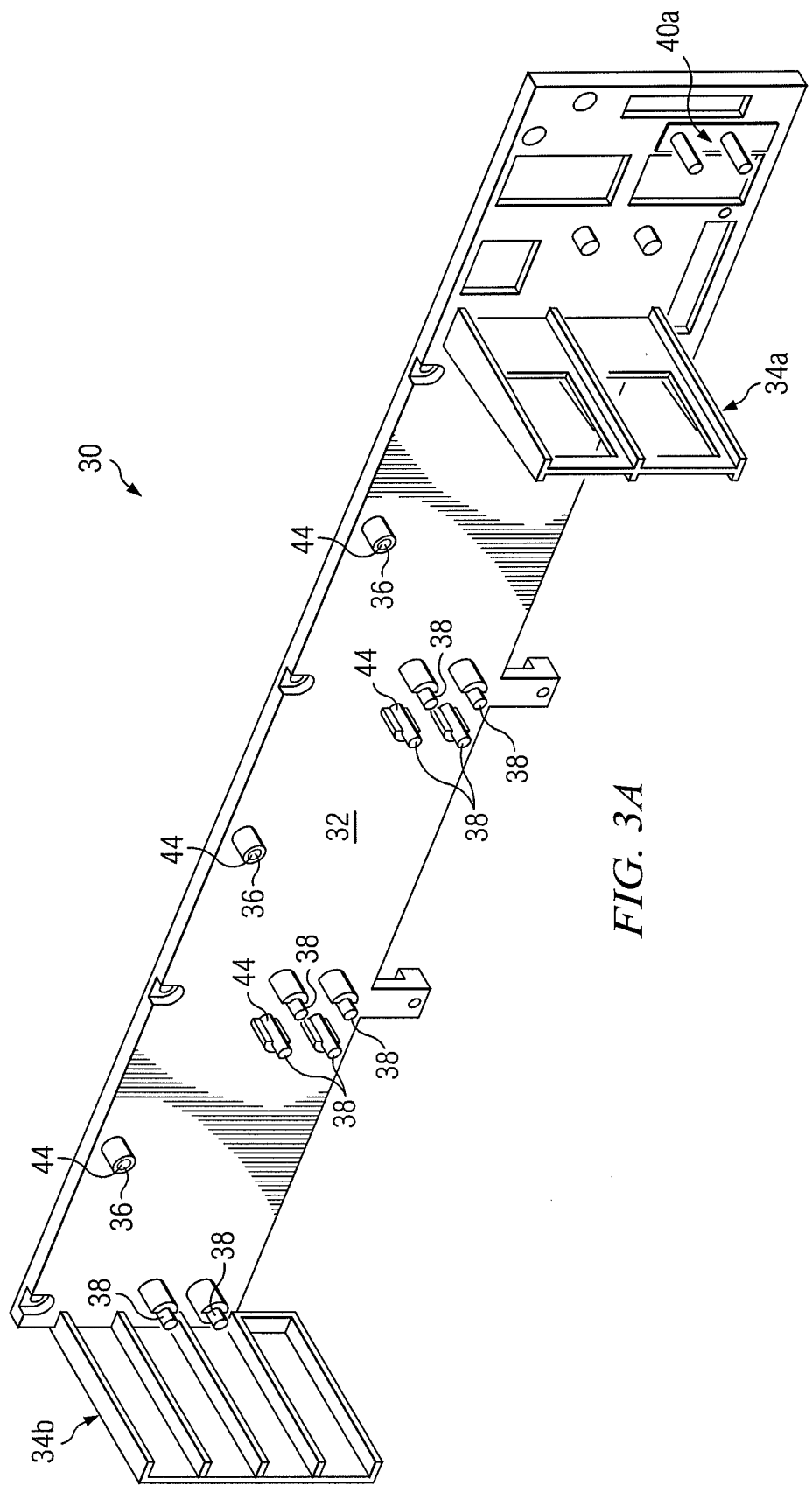
FIGS. 3A and 3B illustrate an example rear cover for use in association with a server chassis, in accordance with teachings of the present disclosure.
Figure 3B:
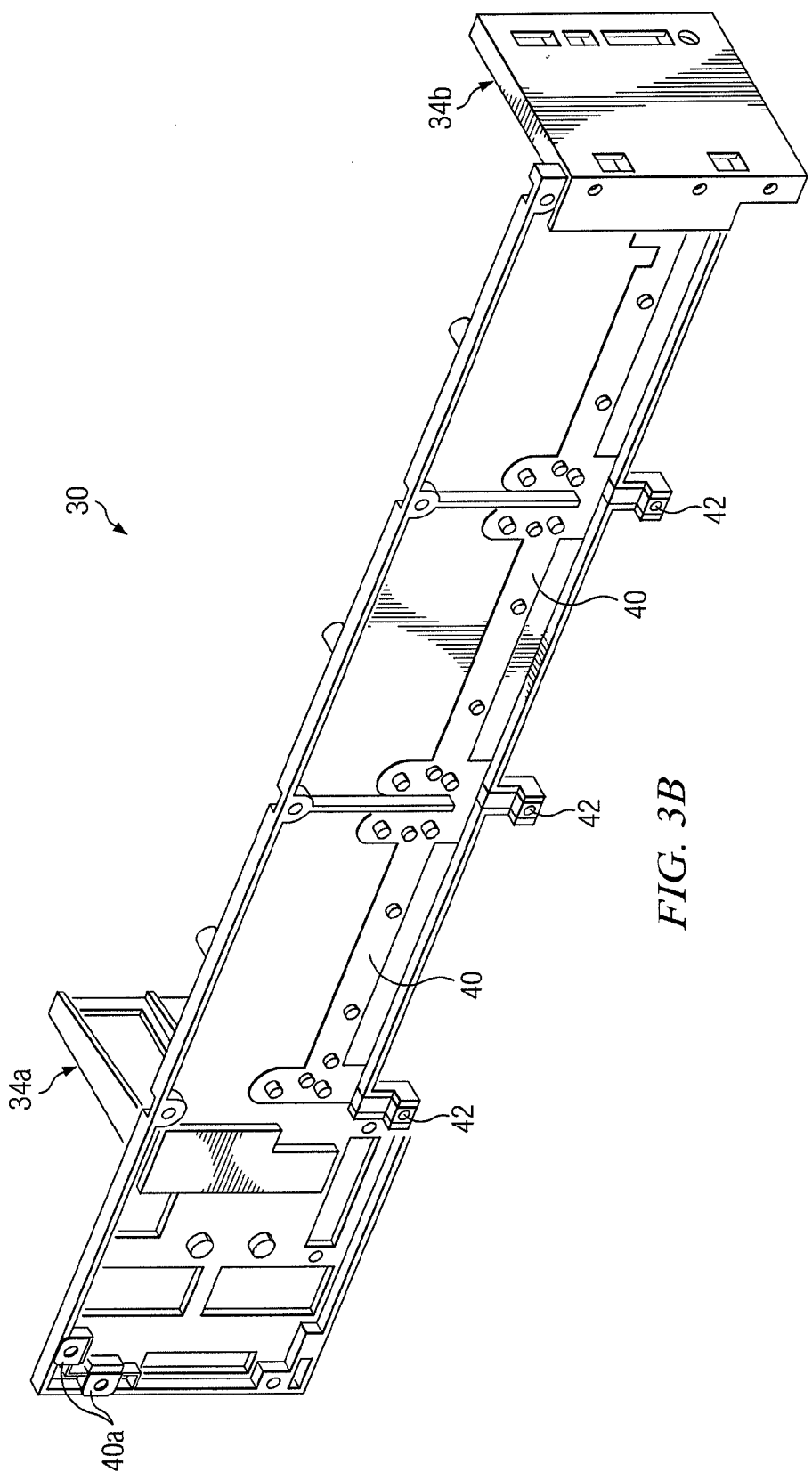

FIGS. 3A and 3B show details of an example rear cover 30 in accordance with teachings of the present disclosure, including a panel 32, cable brackets 34, mounting features 36, alignment features 38, and a ground strap 40. Panel 32 may mount to shelf 26 adjacent the backplane disposed therein to cover the backplane. Panel 32 may be made of any appropriate material to provide protection for the electronic components of the backplane. Panel 32 consisting of plastic may be molded in a single manufacturing step and may include additional features without the need for separate components and/or assembly steps (e.g., mounting features 36 and/or alignment features 38). For example, panel 32 may include molded text incorporated in the plastic mold without the need for labeling and/or silkscreens.

Embodiments in which panel 32 consists of non-conductive plastic, however, may provide reduced materials cost in comparison to metal panels and/or panels made of conductive plastics. For example, panel 32 may be fabricated from polycarbonate (PC), acrylonitrile butadiene styrene (ABS), and/or a blend of PC/ABS.

Mounting features 36 may include threaded holes, pins, and/or other features providing physical connections between panel 32 and other components of rear cover 30. For example, mounting features 36 may provide snap-fits and/or compression clamping of plastic parts without rivets and/or other secondary connectors. In panels made of folded and/or formed sheet metal, mounting features may require press-in inserts for threaded holes and rivets or other secondary connectors.

Alignment features 38 may include various notches, pins, v-slots, and/or any other feature of panel 32 configured to provide an indicator for the alignment and/or insertion of I/O panel 50 to rear cover 30. In some embodiments, the connection between I/O panel 50 and rear cover 30 is a blind connection, where a person installing I/O panel 50 cannot see the connection as he or she is inserting I/O panel 50. Alignment features 38 may reduce the chances of improper installation and/or reduce the time and/or effort for proper installation of I/O panel 50. In panels made of folded and/or formed sheet metal, alignment features may require press-in inserts for guidance pins.

Panel 32 consisting of non-conductive plastic may provide reduced cost and simplified manufacturing in comparison to metal panels and/or panels made of conductive plastics, but may not provide safety grounds and/or electrical connectivity for an I/O panel 50. Embodiments including panel 32 consisting of non-conductive plastic may include ground strap 40 to provide safety grounds and/or electrical connectivity for I/O panel 50.

Ground strap 40 may include any feature, device, and/or component of rear cover 30 configured to provide an electrical connection between I/O panel 50 and a ground circuit. For example, ground strap 40 may provide a connection to a ground circuit associated with a rack system, with shelf 26, and/or with the backplane. In some embodiments, ground strap 40 may include a strip of metal or other electrically conductive material overmolded and/or heatstaked into plastic panel 32. Ground strap 40 may include a first exposed portion 42 and a second exposed portion 44, allowing electrical communication between components in contact with the exposed portions. For example, second exposed portions 44 may include a threaded insert 36 and/or a guide pin 38.

Some embodiments of ground strap 40 may include multiple exposed portions providing selective grounding to multiple I/O panels 50. Ground strap 40 may provide similar electrical conductivity to rear covers fabricated from sheet metal. For example, in some embodiments such as that shown in FIGS. 3A and 3B, ground strap 40a may provide at least 20 amp safety ground shunt capability. In one particular embodiment, second exposed portion 44 of ground strap 40 may include threaded inserts used to connect I/O panel 50 to rear cover 30, providing an electrical connection between at least part of I/O panel 50 and ground strap 40. First exposed portion 42 of ground strap 40 may be in electrical contact with a ground circuit associated with shelf 26, completing the grounding of I/O panel 50.

Various embodiments of ground strap 40 may include different locations for multiple exposed portions. For example, exposed portions may be disposed at connection points between rear cover 30 and shelf 26. As another example, exposed portions may include feet, clips, and/or other protruding features which come into contact with shelf 26 as rear cover 30 is attached thereto. Some embodiments of rear cover 30 and/or panel 32 may include multiple ground straps 40, providing electrical connection to shelf 26 and/or the rack system at multiple locations.

Figure 4A:
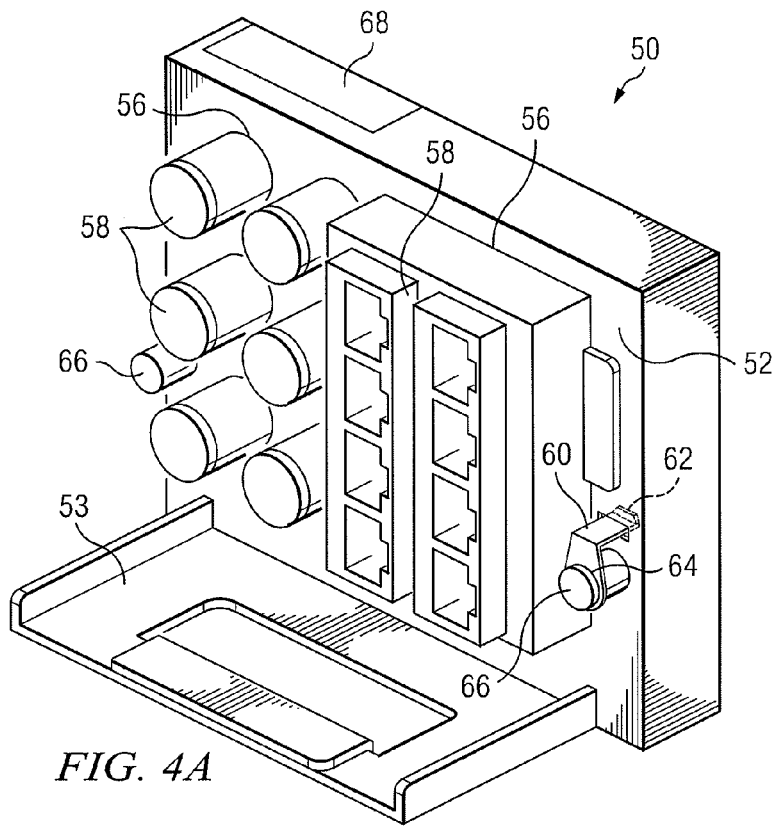
FIGS. 4A and 4B illustrate an example input/output panel for use in association with a server chassis, in accordance with teachings of the present disclosure.
Figure 4B:
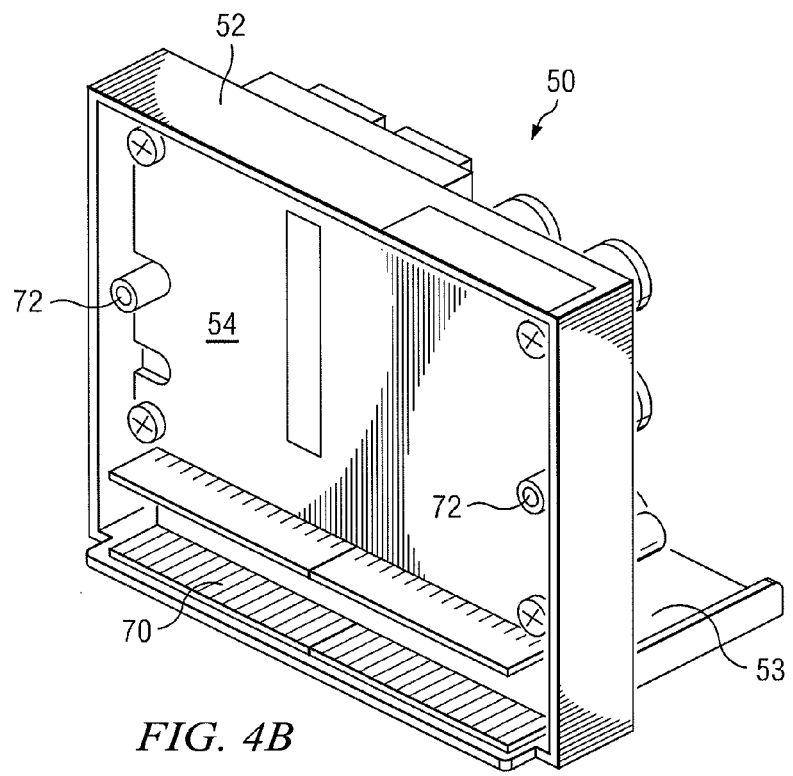

FIGS. 4A and 4B show details of an example input/output panel 50 in accordance with teachings of the present disclosure. Input/output panel 50 may include a cover 52, handle 53, an I/O interface circuit board 54, holes 56, I/O ports 58, ground clip 60, interface connectors 70, and/or alignment features 72. I/O panel 50 may be inserted and/or removed from rear cover 30 to provide various combinations of I/O ports 58 for shelf 26 without replacing the backplane and/or rear cover 30.

Cover 52 may include any device, feature, and/or component of I/O panel 50 configured to house I/O interface circuit board 54. Cover 52 may provide mechanical and/or physical protection to any electronic components associated with and/or mounted on I/O interface circuit board 54. Cover 52 may include any features and/or devices providing mounting points for handle 53, I/O interface circuit board 54, ground clip 60, and/or alignment features 72.

Cover 52 may be made of any appropriate material. Cover 52 consisting of plastic may be molded in a single manufacturing step and may include additional features without the need for separate components and/or assembly steps (e.g., handle 53 and/or alignment features 72). For example, cover 52 may include molded text incorporated in the plastic mold without the need for labeling and/or silkscreens. Embodiments in which cover 52 consists of non-conductive plastic, however, may provide reduced materials cost in comparison to metal panels and/or panels made of conductive plastics. For example, cover 52 may be fabricated from polycarbonate (PC), acrylonitrile butadiene styrene (ABS), and/or a blend of PC/ABS. Covers 52 made of metal may require additional fabrication steps to apply labeling and/or install attachment features.

Handle 53 may include any device, feature, and/or component of I/O panel 50 configured to allow a user to grasp I/O panel 50 for insertion and/or removal. For example, handle 53 may include an integral bracket formed with cover 52. As another example, handle 53 may include a separate component attached to cover 52 with a snap-fit and/or compression fit.

I/O interface circuit board 54 may include a printed circuit board (PCB) that connects to the backplane of shelf 26 through interface connectors 70. The PCB may include various tracings and/or circuitry providing electrical operability and/or connections between various components mounted on I/O interface circuit board 54, including a plurality of I/O ports 58. I/O interface circuit board 54 may be housed at least partially within cover 52. Holes 56 in cover 52 may allow I/O ports 58 to extend from I/O interface circuit board 54 through cover 52 for access from the outside. Holes 56 may be designed and/or selected to conform to various combinations of I/O ports 58 as desired by a user.

I/O ports 58 may comprise a variety of connectors for transmitting one or more signals. For example, some I/O panels 50 may include one or more DS1 or DS3 ports 58. Other I/O panels 50 may include Ethernet ports 58, such as 10BASE-T, 100BASE-T, or 1000BASE-T. The particular combination and/or layout of I/O ports 58 may be selected by a user to provide the connections that the user needs for his or her applications.

Ground clip 60 may include any feature, device, and/or component of I/O panel 50 configured to provide an electrical connection between I/O interface circuit board 54 and a ground circuit. For example, ground clip 60 may provide a connection to a ground circuit associated with rear cover 30 and/or ground strap 40. In some embodiments, ground clip 60 may include a strip of metal or other electrically conductive material overmolded into cover 52. Ground clip 60 may include a first end 62 and a second end 64, allowing electrical communication between components in contact with the exposed portions.

In some embodiments, first end 62 of ground clip 60 may be in contact with I/O interface circuit board 54 when I/O interface circuit board 54 is disposed at least partially within I/O panel 50. Second end 64 of ground clip 60 may be in contact with a grounded portion of rear cover 30 when I/O panel 50 is installed on rear cover 30. Providing a ground for I/O interface circuit board 54 may provide a discharge path for electrical fast transient (EFT) conduction, electro-static discharge (ESD) conduction, and/or electromagnetic induced (EMI) conduction.

In one embodiment, second end 64 of ground clip 60 may be engaged by a connector attaching I/O panel 50 to rear cover 30. For example, I/O panel 50 may include a hole in cover 52 allowing a connector to pass through cover 52 into a threaded hole associated with rear cover 30. The connector may be in electrical and/or physical contact with both second end 64 of ground clip 60 and a ground circuit associated with rear cover 30 (e.g., ground strap 40).

Interface connectors 70 may include one or more connectors configured to provide electronic communication between I/O interface circuit board 54, including any associated electronic components, and the backplane associated with shelf 26. Interface connectors 70 may be disposed on I/O interface circuit board 54 and/or cover 52.

Alignment features 72 may include various notches, pins, v-slots, and/or any other feature of I/O panel 50 and/or cover 52 configured to provide an indicator for the alignment and/or insertion of I/O panel 50 to rear cover 30. In some embodiments, the connection between I/O panel 50 and rear cover 30 is a blind connection, where a person installing I/O panel 50 cannot see the connection as he or she is inserting I/O panel 50. Alignment features 72 may reduce the chances of improper installation and/or reduce the time and/or effort for proper installation of I/O panel 50. In I/O panels made of folded and/or formed sheet metal, alignment features may require press-in inserts for guidance pins and/or other additional manufacturing steps.

Although the present invention has been described with several embodiments, various changes and modifications may be suggested to one skilled in the art. It is intended that the present invention encompass such changes and modifications as fall within the scope of the appended claims.

What is claimed is:

1. An input/output panel for use with a server chassis, the panel comprising:
    a cover of non-conductive plastic configured to mount to a rear cover of the server chassis;
    an input/output interface circuit board disposed on a first side of the cover;
    a plurality of interfaces disposed on the input/output interface circuit board and extending at least partially through the cover to the second side of the cover;
    a ground clip including a conductive component partially disposed within the plastic cover;
    a first end of the ground clip extending from the first side of the cover, the first end configured to mate with the input/output interface circuit board; and
    a second end of the ground clip extending from the second side of cover, the second end configured to mate through a connector to a ground circuit associated with the rear cover of the server chassis.

2. An input/output panel according to claim 1, further comprising the ground clip overmolded into the plastic cover.

3. An input/output panel according to claim 1, further comprising text molded on the cover identifying one or more ports associated with the input/output interface circuit board.

4. An input/output panel according to claim 1, further comprising a handle extending from the panel, the handle configured to allow a user to grasp the panel for insertion or removal.

5. An input/output panel according to claim 1, further comprising a second ground clip.

6. An input/output panel according to claim 1, further comprising a set of input/output interface connectors providing electronic communication between the input/output interface circuit board and electronic components mounted within the server chassis.

7. An input/output panel according to claim 1, further comprising one or more alignment features configured to assist insertion of the input/output panel into a rear cover by a user.

8. An input/output panel according to claim 1, wherein the plurality of interfaces disposed on the input/output interface circuit board includes at least one Ethernet connector.

9. An input/output panel according to claim 1, wherein the plurality of interfaces disposed on the input/output interface circuit board includes at least one DS3 connector.

10. An input/output panel according to claim 1, wherein the plurality of interfaces disposed on the input/output interface circuit board includes at least one DS1 connector.

11. A rear cover for use with a server chassis, the rear cover comprising:
    a panel of non-conductive plastic configured to mount to the rear of the server chassis adjacent a backplane disposed at least partially within the server chassis;
    a conductive ground strap partially disposed within the plastic panel;
    a first exposed portion of the ground strap disposed on a first side of the plastic panel, the first exposed portion configured to provide electrical connection with one or more electronic components disposed within the server chassis; and
    a second exposed portion of the ground strap disposed on a second side of the plastic panel, the second exposed portion configured to mate with a ground circuit associated with the server chassis.

12. A rear cover according to claim 11, further comprising the ground strap overmolded into the plastic panel.

13. A rear cover according to claim 11, further comprising one or more mounting features molded into the plastic panel allowing an input/output panel to be mounted to the rear cover.

14. A rear cover according to claim 11, further comprising one or more alignment features molded into the plastic panel assisting an input/output panel to be mounted to the rear cover.

15. A rear cover according to claim 11, further comprising an input/output panel.

16. A rear cover according to claim 11, further comprising text molded into the panel.

17. A rear cover according to claim 11, further comprising two cable brackets attached to the panel by snap fit without separate mechanical fasteners.

18. A rear cover according to claim 11, further comprising a second ground strap configured to provide safety ground shunting from a first side of the rear cover to a second side of the rear cover.

19. A server chassis for use with a communication network, the server chassis comprising:
- a shelf for housing one or more electronic components of the communication network;
- one or more mounting brackets configured to mount the shelf to a rack system;
- a rear cover comprising:
  - a panel of non-conductive plastic configured to mount to the rear of the server chassis adjacent a backplane disposed at least partially within the shelf;
  - a cable bracket extending from the panel, the cable bracket providing a physical mounting location for cables and cable ties;
  - a ground strap including a conductive component partially disposed within the plastic panel;
  - a first exposed portion of the ground strap, the first exposed portion configured to provide electrical connection with various electronic components disposed within the server chassis; and
- an input/output panel configured to mount to the rear cover, the panel comprising:
  - a cover of non-conductive plastic configured to mount to the rear cover;
  - an input/output interface circuit board disposed on a first side of the input/output panel;
  - a plurality of interfaces disposed on the input/output interface circuit board and extending at least partially through the cover to the second side of the input/output panel;
  - a ground clip including a conductive component partially disposed within the plastic cover;
  - a first end of the ground clip extending from the first side of the cover, the first end configured to mate with the input/output interface circuit board; and
  - a second end of the ground clip extending from the first side of the cover, the second end configured to mate with a second exposed portion of the ground strap of the rear cover.

20. The server chassis of claim 19, further comprising the ground strap overmolded into the plastic panel of the rear cover.

21. The server chassis of claim 19, wherein the rear cover further comprises one or more mounting features for the input/output panel to be mounted to the rear cover.

22. The server chassis of claim 19, wherein the rear cover further comprises one or more alignment features for the input/output panel to be mounted to the rear cover, the one or more alignment features molded into the plastic panel of the rear cover.

23. The server chassis of claim 19, wherein the input/output panel further comprises the ground clip overmolded into the plastic cover.

24. The server chassis of claim 19, wherein the input/output panel further comprises text molded into the cover identifying one or more ports associated with the input/output interface circuit board.

25. The server chassis of claim 19, wherein the input/output panel further comprises a handle extending from the panel, the handle configured to allow a user to grasp the panel for insertion or removal.

26. The server chassis of claim 19, wherein the input/output panel further comprises a set of input/output interface connectors providing electronic communication between the input/output interface circuit board and electronic components mounted within the server chassis.

27. The server chassis of claim 19, wherein the input/output panel further comprises one or more alignment features configured to assist insertion of the input/output panel into the rear cover by a user, the one or more alignment features molded into the plastic panel of the rear cover.

28. The server chassis of claim 19, further comprising the two cable brackets attached to the plastic panel of the rear cover by snap fit without separate mechanical fasteners.

* * * * *